(12) United States Patent
Matsumoto

(10) Patent No.: US 9,911,945 B2
(45) Date of Patent: Mar. 6, 2018

(54) DISPLAY DEVICE

(71) Applicant: Japan Display Inc., Minato-ku (JP)

(72) Inventor: Yuko Matsumoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/419,513

(22) Filed: Jan. 30, 2017

(65) Prior Publication Data

US 2017/0250375 A1   Aug. 31, 2017

(30) Foreign Application Priority Data

Feb. 29, 2016   (JP) .................................. 2016-036855

(51) Int. Cl.
| | |
|---|---|
| *H01L 33/00* | (2010.01) |
| *H01L 51/52* | (2006.01) |
| *H01L 27/32* | (2006.01) |

(52) U.S. Cl.
CPC ...... *H01L 51/5275* (2013.01); *H01L 27/3244* (2013.01); *H01L 51/5256* (2013.01); *H01L 51/5268* (2013.01)

(58) Field of Classification Search
CPC ............. H01L 51/5275; H01L 51/5256; H01L 51/5268; H01L 27/3244
USPC ........................................................ 257/88
See application file for complete search history.

(56) References Cited

U.S. PATENT DOCUMENTS

| | | | |
|---|---|---|---|
| 2008/0055504 A1* | 3/2008 | Choi ................. | G02F 1/133555 349/38 |
| 2011/0241051 A1 | 10/2011 | Carter et al. | |
| 2014/0042408 A1* | 2/2014 | Akagawa ............ | H01L 51/5253 257/40 |
| 2014/0110688 A1 | 4/2014 | Nakamura et al. | |
| 2015/0021565 A1 | 1/2015 | Min et al. | |

FOREIGN PATENT DOCUMENTS

| | | |
|---|---|---|
| JP | 2012-507110 | 3/2012 |
| JP | 2013-232279 | 11/2013 |
| JP | 2014-86314 | 5/2014 |
| JP | 2015-23023 | 2/2015 |
| JP | 2015-88322 | 5/2015 |

\* cited by examiner

*Primary Examiner* — Tu-Tu Ho
(74) *Attorney, Agent, or Firm* — Oblon, McClelland, Maier & Neustadt, L.L.P.

(57) ABSTRACT

A display device includes: a plurality of pixel electrodes respectively corresponding to a plurality of unit pixels that constitute an image; a light-emitting element layer stacked on the plurality of pixel electrodes so as to be in contact with each of the plurality of pixel electrodes and provided so as to emit light with a luminance controlled by an electric current; a common electrode provided so as to be stacked on and in contact with the light-emitting element layer above the plurality of pixel electrodes; and a sealing layer made of a light-transmissive material and stacked on the common electrode so as to seal the light-emitting element layer. The sealing layer is formed of a plurality of layers that are stacked on one another. The interface between two adjacent layers of the plurality of layers includes irregularities in regions located above the plurality of pixel electrodes.

5 Claims, 5 Drawing Sheets

DISPLAY DEVICE

CROSS-REFERENCE TO RELATED APPLICATION

The present application claims priority from Japanese application JP2016-036855 filed on Feb. 29, 2016, the content of which is hereby incorporated by reference into this application.

BACKGROUND OF THE INVENTION

1. Field of the Invention

The present invention relates to a display device.

2. Description of the Related Art

High luminance, high color purity, and wide viewing angle are required of an organic electroluminescent display device. Moreover, for preventing the deterioration of an organic electroluminescent element, a sealing structure (JP 2015-23023 A) to seal out moisture and oxygen is generally provided, and a method for providing a multilayer structure including an inorganic film and an organic film has been proposed.

For achieving high luminance, high color purity, and wide viewing angle, attachment of an optical sheet or provision of an optical structure has been conventionally proposed (JP 2015-88322 A and JP 2012-507110 T). However, newly adding a layer involves, in addition to a cost problem, a problem of a reduction in light extraction efficiency due to increased interfaces (JP 2013-232279 A and JP 2014-86314 A).

The purpose of the sealing structure formed of the multilayer structure is to improve a covering property so that even when a foreign substance is present, a hole is not made, or to improve strength corresponding to flexibility, and a multilayer film is uniformly formed. In this case, reflection occurs at the interface between the inorganic film and the organic film, thus involving a problem of a reduction in light extraction efficiency.

SUMMARY OF THE INVENTION

It is an object of the invention to achieve high luminance, high color purity, or wide viewing angle while suppressing a reduction in light extraction efficiency even when a sealing structure formed of a multilayer structure is included.

A display device according to an aspect of the invention includes: a plurality of unit pixels; a plurality of pixel electrodes each included in each of the plurality of unit pixels; a light-emitting element layer in contact with each of the pixel electrodes; a common electrode located on an opposite side of the light-emitting element layer from the pixel electrodes and in contact with the light-emitting element layer; and a sealing layer located on an opposite side of the common electrode from the light-emitting element layer and covering the common electrode, wherein the sealing layer includes a plurality of layers that are stacked on one another, and at least one of interfaces each between two adjacent layers of the plurality of layers includes irregularities in regions overlapping the pixel electrodes in a plan view.

According to the aspect of the invention, light can be converged or diffused by the irregularities located at the interface between the two adjacent layers of the sealing layer, and thus high luminance, high color purity, or wide viewing angle can be achieved.

A display device according to another aspect of the invention includes: a plurality of unit pixels; a plurality of pixel electrodes each included in each of the plurality of unit pixels; a light-emitting element layer in contact with each of the pixel electrodes; a common electrode located on an opposite side of the light-emitting element layer from the pixel electrodes and in contact with the light-emitting element layer; and a sealing layer located on an opposite side of the common electrode from the light-emitting element layer and covering the common electrode, wherein the sealing layer includes an intermediate layer containing fine particles configured to scatter light, and a pair of inorganic layers that interpose the intermediate layer therebetween.

According to the aspect of the invention, light can be scattered by the fine particles contained in the intermediate layer of the sealing layer, and thus high luminance, high color purity, or wide viewing angle can be achieved.

DETAILED DESCRIPTION OF THE INVENTION

Hereinafter, an embodiment of the invention will be described with reference to the drawings.

Figure 1:
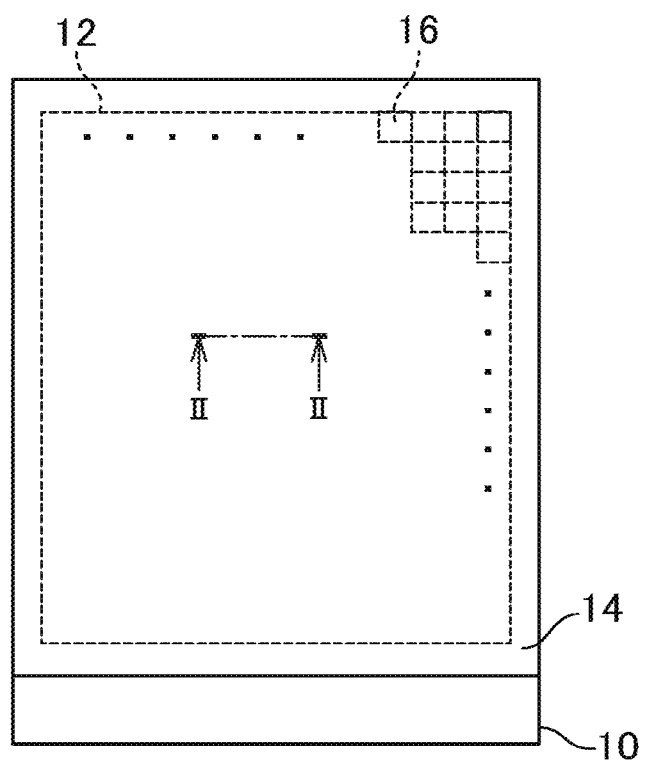
FIG. 1 is a schematic view showing a display device according to an embodiment of the invention.
Figure 2:
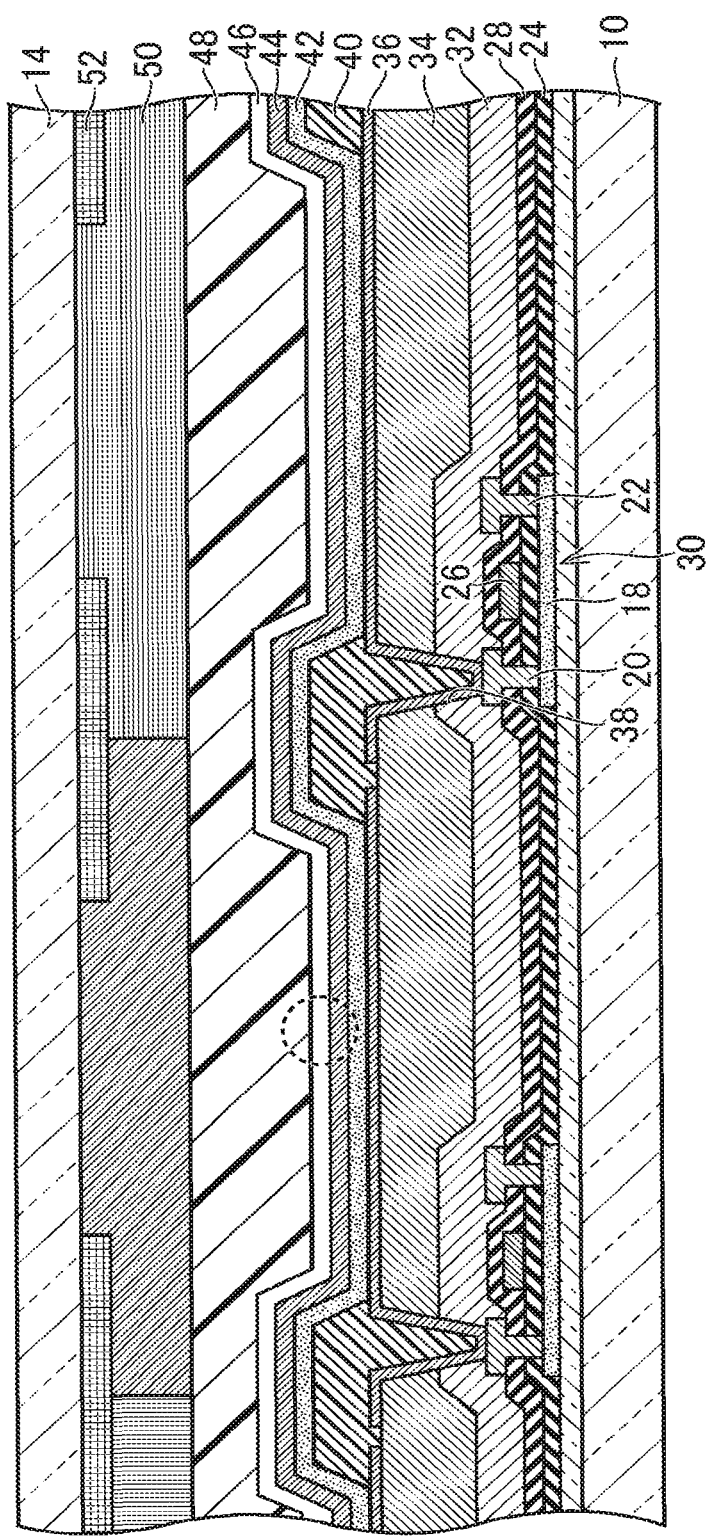
FIG. 2 is a cross-sectional view of the display device shown in FIG. 1, taken along the line II-II.

FIG. 1 is a schematic view showing a display device according to the embodiment of the invention. FIG. 2 is a cross-sectional view of the display device shown in FIG. 1, taken along the line II-II. As the display device, an organic electroluminescent display device is exemplified. The display device includes a circuit substrate 10. A counter substrate 14 including a display area 12 is stacked on the circuit substrate 10. An image formed of a plurality of unit pixels 16 composed of light is displayed in the display area 12.

As shown in FIG. 2, a semiconductor layer 18 is formed on the circuit substrate 10. A source electrode 20 and a drain electrode 22 are provided on the semiconductor layer 18. A gate insulating film 24 is formed to cover the semiconductor layer 18, and a gate electrode 26 is formed on the gate insulating film 24. An inter-layer insulating film 28 is formed to cover the gate electrode 26. The source electrode 20 and the drain electrode 22 penetrate the gate insulating film 24 and the inter-layer insulating film 28. The semiconductor layer 18, the source electrode 20, the drain electrode 22, and the gate electrode 26 constitute a thin film transistor 30. A passivation film 32 is provided so as to cover the thin film transistor 30.

A planarization layer 34 is provided on the passivation film 32. A plurality of pixel electrodes 36 configured so as to respectively correspond to the plurality of unit pixels 16 are provided on the planarization layer 34. The planarization layer 34 is formed such that at least the surface on which the pixel electrode 36 is provided is flat. The pixel electrode 36 is formed of, for example, a light-reflecting lower layer and a light-transmitting upper lower, and reflects light. The pixel electrode 36 is electrically connected to one of the source electrode 20 and the drain electrode 22 on the semiconductor layer 18 through a contact hole 38 penetrating the planarization layer 34, the passivation film 32, and the inter-layer insulating film 28.

An insulating layer 40 is formed on the planarization layer 34 and the pixel electrode 36. The insulating layer 40 is formed so as to lie on the peripheral edge of the pixel electrode 36 and open a portion (e.g., a central portion) of the pixel electrode 36. The insulating layer 40 forms a bank surrounding a portion of the pixel electrode 36.

A light-emitting element layer 42 is provided on the pixel electrode 36. The light-emitting element layer 42 continuously lies on the plurality of pixel electrodes 36 and also lies on the insulating layer 40. As a modified example, the light-emitting element layer 42 maybe provided individually (separately) for each of the pixel electrodes 36. The light-emitting element layer 42 includes at least a light-emitting layer, and may further include at least one layer of an electron transport layer, a hole transport layer, an electron injection layer, and a hole injection layer.

A common electrode 44 (e.g., a cathode) is provided on the light-emitting element layer 42 so as to be in contact with the light-emitting element layer 42 above the plurality of pixel electrodes 36. The common electrode 44 is formed so as to lie above the insulating layer 40 serving as a bank. The light-emitting element layer 42 is interposed between the pixel electrode 36 and the common electrode 44, and emits light with a luminance controlled by an electric current flowing therebetween.

The light-emitting element layer 42 is sealed by a sealing layer 46 stacked on the common electrode 44 so as to seal the light-emitting element layer 42, so that the light-emitting element layer 42 is shielded from moisture. The counter substrate 14 is provided above the sealing layer 46 with a filling layer 48 therebetween. Colored layers 50 of multiple colors (e.g., blue, red, and green) are provided on the counter substrate 14, and a black matrix 52 is formed of metal or resin between the colored layers 50 of different colors adjacent to each other, so that a color filter is configured. The counter substrate 14 may be a touch panel, and may include a polarizer or a retardation film.

Figure 3:
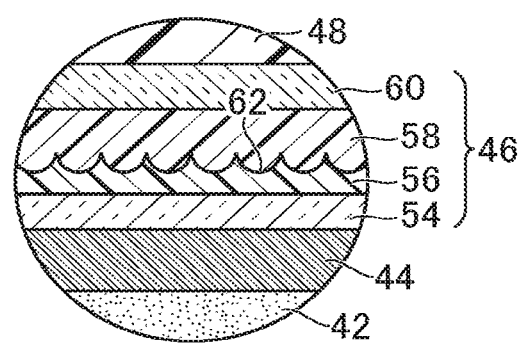
FIG. 3 is an enlarged view of a portion surrounded by the broken line circle in FIG. 2.

FIG. 3 is an enlarged view of a portion surrounded by the broken line circle in FIG. 2. The sealing layer 46 is made of a light-transmissive material, and formed of a plurality of layers (a first layer 54, a second layer 56, a third layer 58, and a fourth layer 60 in the example of FIG. 3) that are stacked on one another. The first layer 54 located at the lowermost layer and the fourth layer 60 located at the uppermost layer are made of an inorganic material having a high barrier property to moisture, such as $SiN_x$, SiON, $SiO_2$, $Al_2O_3$, or $TiO_2$. The second layer 56 and the third layer 58, which are adjacent to each other so as to include an interface, intervene between the first layer 54 and the fourth layer 60, which are paired inorganic layers. The second layer 56 and the third layer 58 may be formed of an organic material such as phenol resin, epoxy resin, acrylic resin, melamine resin, or urea resin, or may be formed of an inorganic material such as $ZrO_2$, $TiO_2$, $Al_2O_3$, $In_2O_3$, ZnO, $SnO_2$, or $Sb_2O_3$.

The interface between two adjacent layers (the second layer 56 and the third layer 58) of the plurality of layers includes irregularities in regions above the plurality of pixel electrodes 36. The irregularities include a plurality of concave portions 62 serving as concave lenses in a direction toward the light-emitting element layer 42. The irregularities can be formed by transfer of patterns. Alternatively, the irregularities may be formed of flat inclined surfaces. According to the embodiment, light can be converged or diffused by the irregularities located at the interface between the second layer 56 and the third layer 58, and thus high luminance, high color purity, or wide viewing angle can be achieved.

Figure 4:
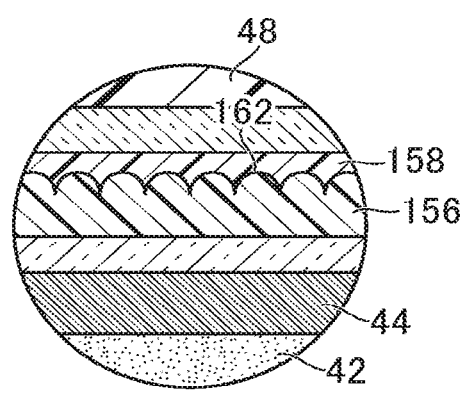
FIG. 4 is a diagram showing Modified Example 1 of the embodiment of the invention.

FIG. 4 is a diagram showing Modified Example 1 of the embodiment of the invention. In this example, irregularities that are formed at the interface between a second layer 156 and a third layer 158 include a plurality of convex portions 162 serving as convex lenses in a direction away from the light-emitting element layer 42.

Figure 5:
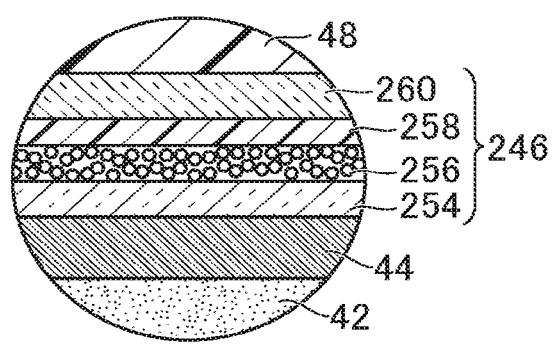
FIG. 5 is a diagram showing Modified Example 2 of the embodiment of the invention.

FIG. 5 is a diagram showing Modified Example 2 of the embodiment of the invention. In this example, in a plurality of layers constituting a sealing layer 246, a second layer 256 that is an intermediate layer interposed between a first layer 254 and a fourth layer 260 that are the lowermost layer and the uppermost layer, respectively, contains fine particles that scatter light. The fine particles are made of a light-transmissive material. Organic fine particles can be formed of polymethylmethacrylate particles, acrylic-styrene copolymer particles, melamine particles, polycarbonate particles, polystyrene particles,or the like. Inorganic fine particles can be formed of $ZrO_2$, $TiO_2$, $Al_2O_3$, $In_2O_3$, ZnO, $SnO_2$, $Sb_2O_3$, or the like. Although a third layer 258 that is another intermediate layer interposed between the first layer 254 and the fourth layer 260 does not contain the fine particles, the fine particles may be dispersed in the third layer 258. That is, a plurality of intermediate layers containing fine particles that scatter light may be provided. According to Modified Example 2, light can be scattered by the fine particles contained in the intermediate layer of the sealing layer, and thus high luminance, high color purity, or wide viewing angle can be achieved.

The display device is not limited to an organic electroluminescent display device, but may be a display device including a light-emitting element such as a quantum-dot light-emitting element (quantum-dot light-emitting diode (QLED)) in each pixel.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
a plurality of unit pixels;
a plurality of pixel electrodes each included in each of the plurality of unit pixels;
a light-emitting element layer in contact with each of the pixel electrodes;
a common electrode located on an opposite side of the light-emitting element layer from the pixel electrodes and in contact with the light-emitting element layer; and
a sealing layer located on an opposite side of the common electrode from the light-emitting element layer and covering the common electrode, wherein
the sealing layer includes a plurality of layers that are stacked on one another,
at least one of interfaces each between two adjacent layers of the plurality of layers includes irregularities in regions overlapping the pixel electrodes in a plan view, and
the plurality of layers include a pair of inorganic layers that interpose the two adjacent layers therebetween.

2. The display device according to claim 1, wherein
the irregularities include a plurality of convex portions which are convex lenses and protrude toward an opposite direction of the light-emitting element layer.

3. The display device according to claim 1, wherein
the irregularities include a plurality of concave portions which are concave lenses and dent toward the light-emitting element layer.

4. A display device comprising:
a plurality of unit pixels;
a plurality of pixel electrodes each included in each of the plurality of unit pixels;
a light-emitting element layer in contact with each of the pixel electrodes;
a common electrode located on an opposite side of the light-emitting element layer from the pixel electrodes and in contact with the light-emitting element layer; and
a sealing layer located on an opposite side of the common electrode from the light-emitting element layer and covering the common electrode, wherein
the sealing layer includes an intermediate layer containing fine particles configured to scatter light, and a pair of inorganic layers that interpose the intermediate layer therebetween.

5. The display device according to claim 4, wherein
the fine particles are made of a light-transmissive material.

* * * * *